(12) United States Patent
Pham et al.

(10) Patent No.: US 6,730,170 B1
(45) Date of Patent: May 4, 2004

(54) ENCAPSULANT MATERIAL APPLICATOR FOR SEMICONDUCTOR WAFERS AND METHOD OF USE THEREOF

(75) Inventors: Ken Pham, San Jose, CA (US); Nikhil Vishwanath Kelkar, San Jose, CA (US); Vivek Kishorechand Arora, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 315 days.

(21) Appl. No.: 09/715,358

(22) Filed: Nov. 17, 2000

(51) Int. Cl.[7] .................................................. B05C 3/00
(52) U.S. Cl. ...................................... 118/406; 118/504
(58) Field of Search ................................. 118/406, 120, 118/108, 504, 301; 101/123, 120, 124; 438/942, 945

(56) References Cited

U.S. PATENT DOCUMENTS

| | | | |
|---|---|---|---|
| 2,783,709 A | * | 3/1957 | Thomas |
| 2,863,382 A | * | 12/1958 | Giani |
| 3,878,780 A | * | 4/1975 | Lotte |
| 3,943,849 A | * | 3/1976 | Vasilantone |
| 4,299,164 A | * | 11/1981 | Jonkers |
| 4,715,278 A | * | 12/1987 | Ericsson |
| 4,909,145 A | * | 3/1990 | Ericsson |
| 5,694,843 A | * | 12/1997 | Chen |
| 5,704,286 A | * | 1/1998 | Takashima |
| 5,813,330 A | * | 9/1998 | Newman |
| 6,023,094 A | * | 2/2000 | Kao et al. |
| 6,237,490 B1 | * | 5/2001 | Takahashi et al. |

* cited by examiner

Primary Examiner—Brenda A. Lamb
(74) Attorney, Agent, or Firm—Beyer Weaver & Thomas, LLP

(57) ABSTRACT

An encapsulant applicator comprising a flexor formed of a resilient material and a substantially rigid blade is described. The blade is attached to the flexor in a way that during a smoothing process, a force applied through the flexor is distributed across the second edge of the blade. Another aspect of the invention pertains to a system for forming a substantially uniform layer of material on a surface of a semiconductor wafer. The system of the present invention includes a stencil, an applicator and a conveyor device. The stencil is placed over the surface of the wafer so that an opening in the stencil exposes a portion of the surface of the wafer. The conveyor device is connected to the flexor so that during the smoothing process, the conveyor device moves the applicator across the opening of the stencil. Yet another aspect of the invention pertains to a method for applying a substantially uniform layer of flowable material to a surface of a semiconductor wafer using the applicator as described.

12 Claims, 3 Drawing Sheets

ENCAPSULANT MATERIAL APPLICATOR FOR SEMICONDUCTOR WAFERS AND METHOD OF USE THEREOF

FIELD OF THE INVENTION

The present invention relates generally to semiconductor integrated circuit manufacturing processes. More specifically, the present invention relates to applying encapsulant material onto the surfaces of semiconductor wafers.

BACKGROUND

As is well known in the art, integrated circuit devices are fabricated on semiconductor wafers. After the integrated circuit devices (or die) have been fabricated, they are separated from the wafer during what is referred to as a singulation process. One such singulation process, referred to as a saw operation, utilizes a saw having a circular (or other appropriate shape) blade to cut through the wafers along what are referred to as scribe lines (that delineate the individual die). One problem associated with this saw operation, however, is that when the saw blade cuts through the wafer, the surfaces of the wafer can be damaged due to stresses induced in the wafer that typically results in chipping, cracking, etc.

A conventional approach to protecting the surfaces of the wafer during the saw operation utilizes a protective layer of encapsulant material (such as epoxy). In addition to protecting the wafer surfaces, the protective layer of encapsulant provides a surface upon which identifying indicia (i.e., markings) can be placed. These markings are typically used to identify particular classes, or grades, of die (based upon, for example, speed, power, etc.). In order, therefore, to provide optimal protection as well as a surface suitable for clear marking, the protective layer of encapsulating material must be as uniform as possible since a non-uniform layer of encapsulant substantially reduces the protective properties of the encapsulant layer as well as reduces the ability to produce a clear and legible mark.

One approach to forming a uniform layer of encapsulant involves the use of encapsulant applicators that typically take the form of what is referred to as squeegees. A conventionally structured squeegee, however, has the unfortunate tendency to deflect under pressure during a smoothing operation resulting in a non-uniform layer of encapsulant.

In view of the foregoing, an apparatus and a method of forming a layer of encapsulant material having a uniform thickness onto semiconductor wafers would be desirable

SUMMARY

The present invention provides an encapsulant applicator and a method for using the applicator capable of forming a substantially uniform layer of encapsulant material on a surface of a semiconductor wafer. The applicator includes a flexor formed of a resilient material having a first end, and a substantially rigid blade. The blade has a first edge and a second edge, wherein the first edge is attached to the first end of the flexor in a way that during a smoothing process, a force applied through the flexor is distributed across the second edge of the blade.

Another aspect of the invention pertains to a system for forming a substantially uniform layer of material on a surface of a semiconductor wafer. The system of the present invention includes a stencil, an applicator and a conveyor device. The stencil is placed over the surface of the wafer so that an opening in the stencil exposes a portion of the surface of the wafer. The applicator includes a flexor formed of a resilient material having a first end and a second end and a substantially rigid blade having a first edge and a second edge. The first edge of the blade is attached to the first end of the flexor in a way that during a smoothing process, a force applied through the flexor is distributed across the second edge of the blade. The conveyor device is connected to the second end of the flexor so that during the smoothing process, the conveyor device moves the applicator across the opening of the stencil.

Yet another aspect of the invention pertains to a method for applying a substantially uniform layer of flowable material to a surface of a semiconductor wafer using the applicator as described. The method involves sweeping the applicator across an opening of a stencil such that the applicator is in contact with the stencil.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have 7 not been described in detail in order to not unnecessarily obscure the present invention.

The present invention provides an encapsulant applicator capable of forming a substantially uniform layer of encapsulant material on a surface of a wafer. Generally, the encapsulant applicator includes a substantially rigid and elongated blade that is attached to a flexible strip of material (referred to as a flexor) that acts to regulate the pressure with which the blade is pressed upon the stencil during a smoothing operation.

In the described embodiment, during the smoothing operation, encapsulant material is deposited on a surface of the wafer defined by what is referred to as a stencil. As well known in the art, stencils are used to expose a selected portion of a surface of the wafer onto which the encapsulant is deposited. After the encapsulant has been deposited, in one embodiment, a rounded edge of the blade is swept across the stencil thereby removing excess deposited encapsulating material. The rigidity of the blade allows the blade to form a substantially uniform layer of encapsulating material upon the surface of the wafer so defined by the stencil. It is this uniform layer of encapsulating material that substantially protects the surface of the wafer from chipping during the singulation process as well as provides a substantially planar surface suitable for effective marking of the individual wafer.

The invention will now be described in terms of a semiconductor wafer and the associated integrated circuits formed thereon. It should be noted, however, that this invention can be used for any situation where the formation of a substantially uniform layer of viscous material is important. Such situations include, for example, applying encapsulating material during the described integrated circuit singulation procedure, applying solder paste onto wafers during processes for forming solder bumps, and applying under bump metallurgy to allow for better solder bump connections.

Figure 1:
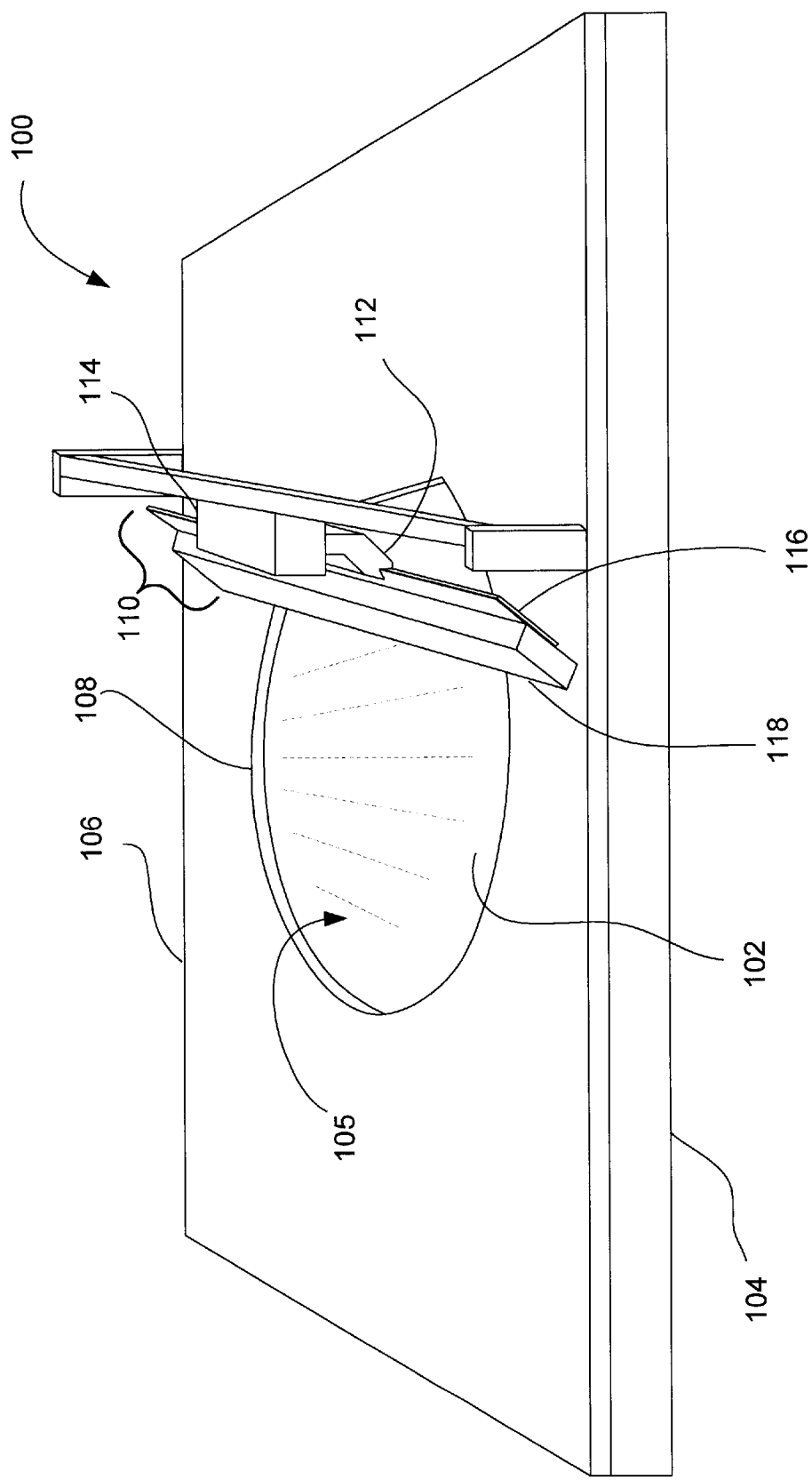
FIG. 1 illustrates a perspective view of one embodiment of a system for applying an encapsulating material onto the surface of a semiconductor wafer.

Turning now to FIG. 1, a side perspective view of an encapsulant application system 100 in accordance with the present invention is shown. The system 100 includes a semiconductor wafer 102 that is secured to a pallet 104 on top of which is placed a stencil 106. In the described embodiment, the stencil 106 is formed of a sheet of stainless steel full hard having an opening 108, that exposes a selected portion of a surface 105 of the wafer 102 Once the stencil 106 is in place and well secured, liquid or gel-like encapsulating material (not shown) such as epoxy is applied within the opening 108 of the stencil 106 such that the exposed surface 105 of the wafer 102 is completely covered by the encapsulant.

An encapsulant applicator 110 is secured to an applicator holder 112, in such a way that a lengthwise portion of the applicator 110 lies flat on (or parallel with) the surface of the stencil 106. The holder 112, in turn, is secured to a conveyor device 114 that is positioned above the stencil 106 and which slides across the stencil opening 108 during a smoothing operation. In this way, during the smoothing operation, the conveyor device 114 moves the encapsulant applicator 110 across the opening 108 of the stencil 106 in such a way that any excess encapsulating material is removed and a substantially uniform layer of encapsulating material is left behind on the selected portion 105 of the wafer 102.

In the described embodiment, the applicator 110 is formed of a flexor 116 onto which is attached a blade 118. The flexor 116, in turn, connects the blade 118 to the applicator holder 112. The holder 112 positions the applicator 110 such that the length of the blade 118 is in contact with the stencil 106. The holder 112 also presses the applicator 110 towards the stencil 106 such that the blade 118 maintains firm contact with the stencil 106. The flexor 116 may bend under the pressure applied by the holder 112, thereby regulating the amount of pressure that the blade 118 exerts upon the stencil 106. The flexor 116 maintains at least a minimum amount of pressure on the blade 118 such that the blade 118 is able to maintain contact with the stencil 106 as the blade 118 encounters the excess encapsulating material on the surface 105 of the wafer 102. At the same time, the flexor 116 prevents the application of excessive pressure that would cause the blade 118 to damage the stencil 106 during the smoothing operation. The flexibility of the flexor 116 also equalizes the pressure exerted by the holder 112 such that an equal amount of pressure is applied along the length of the blade 118. The regulating and equalizing functions of the flexor 116 allow the applicator 110 to form a flat and uniformly thick layer of encapsulating material.

As the applicator 110 is swept over the stencil opening 108, only the outer portions of the blade 116 are in contact with the stencil 106. The applicator 110 is able to form an encapsulating layer of material having a uniform thickness due to the rigidity of the blade 118. Specifically, the rigidity of the blade 118 prevents the pressure applied by the holder 112 from bending the middle portion of the blade 118 downwards into the stencil opening 108. Such bending would cause the middle portion of the blade 118 to remove more encapsulating material than the outer portions of the blade, thereby forming an encapsulating layer with a concave profile and a non-uniform thickness.

Since integrated circuit devices may be formed on wafers of varying diameters, stencils are created to have proportionally sized openings. Consequently, in order to properly apply a uniformly thick layer of encapsulating material within the entire stencil opening, the length of the applicator must be at least as long as the diameter of the stencil opening. For example, applicators 110 of the present invention may be tailored for standard wafer sizes of 4, 5, 6 and 8 or more inches.

Depending upon various semiconductor fabrication parameters, either a single applicator or multiple applicators are attached to the applicator holder 112. Such fabrication characteristics may include viscosity of the encapsulating material and the size of the wafer. Embodiments using a single applicator may be designed to remove encapsulating material while sweeping the applicator across the stencil opening in a single direction. However, in alternative embodiments, the holder positions the applicator 110 such that it removes excess encapsulating material as it sweeps over the stencil opening in both the back and forth directions. On the other hand, embodiments utilizing multiple applicators may be arranged such that each respective applicator is positioned to sweep away excess encapsulating material as it is moved in one specific direction over the surface of the stencil 106. When two applicators are attached to the applicator holder 112, for example, the first (or front) applicator is raised relative to the second (or rear) applicator so that only the first applicator sweeps across the stencil opening in one direction. Upon sweeping in the opposite direction, the first applicator is raised and the second applicator is lowered so that only the second applicator sweeps across the stencil opening. It should be noted that each of the multiple applicators may effectively remove excess encapsulating material in both the back and forth directions in a configuration wherein both the first and second applicators make contact with and sweep across the stencil opening in both directions. It should also be appreciated that the applicator 110 may be used to apply materials other than encapsulating material. For example, the applicator 110 may also be used to apply solder paste onto wafers through a printed screen in order to create solder bump contacts on the wafer.

Figure 2:
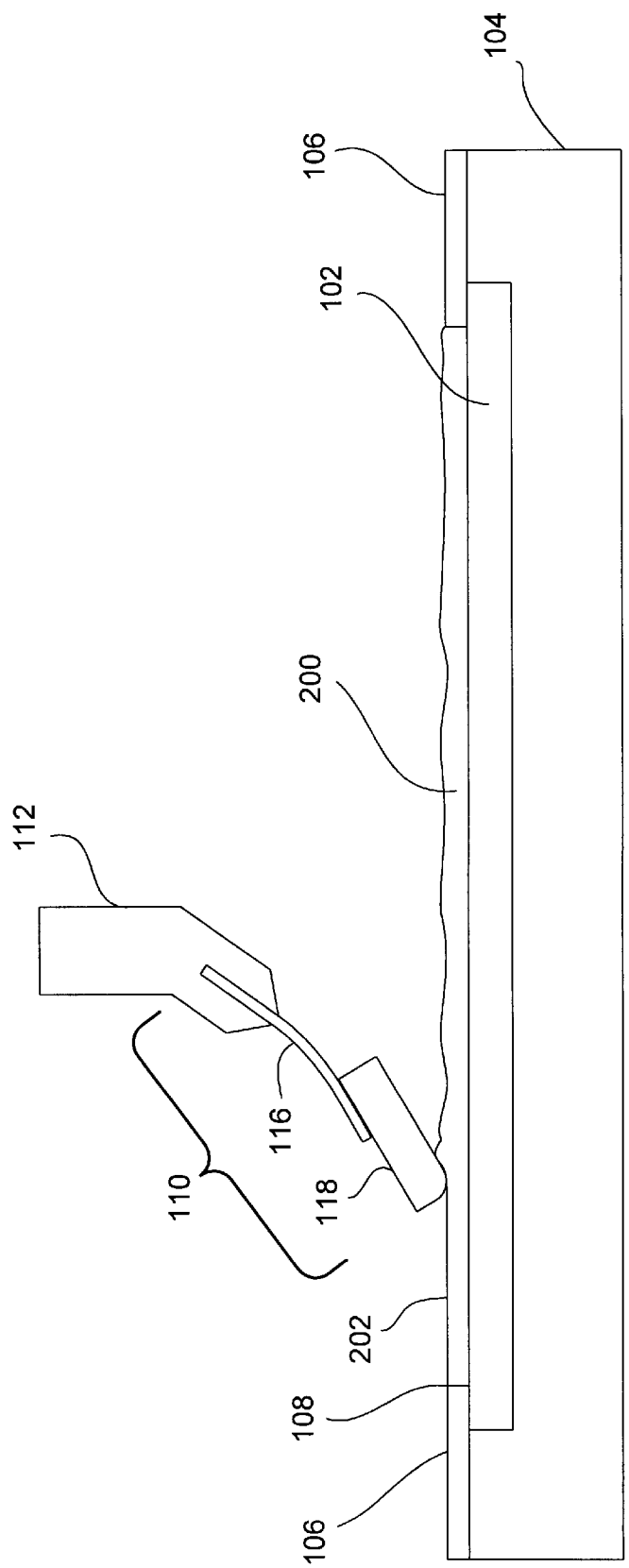
FIG. 2 illustrates a side plan, cross-sectional view of an alternative embodiment of a system for applying an encapsulating material onto the surface of a semiconductor wafer.

FIG. 2 illustrates an enlarged, cross-sectional view of the applicator 110 while being swept across a layer of encapsulating material 200 within the opening 108 of the stencil 106 from left to right. FIG. 2 shows how the encapsulating material 200, which has been swept by the blade 118 (to the left of the blade 118), has a flat and smooth surface 202 since the excess encapsulating material has been swept away by the blade 118. To the right of the blade 118, however, the surface of the encapsulating material 200 is still uneven and rises above the height of the stencil 106. Directly in front of the blade 118 (to the right of the blade 118) the excess encapsulating material 200 is being pushed off of the layer of material 200 at or below the level of the stencil 106.

As can be seen in FIG. 2, the applicator holder 112 clamps onto the upper length-wise portion of the flexor 116. The upper length-wise portion of the blade 118 is attached to the bottom length-wise portion of the flexor 116. The flexor 116 is shown as bending under the downward pressure applied by the applicator holder 112. The flexibility of the flexor 116 regulates the amount of pressure transferred to the blade 118 and therefore the amount of pressure applied by the blade 118 on to the stencil 106. Additionally, the flexor 116 equalizes the pressure applied by the holder 112 along the length of the blade 118.

It is important that the blade 118 have a degree of rigidity sufficient to resist deformation while passing over the opening of the stencil 106. Specifically, the blade 118, which is pressed onto the stencil by the holder 112, must be sufficiently rigid so not to bend into the stencil opening 108 and towards the wafer 102. This allows the applicator 110 to provide the semiconductor wafer 102 with a layer of protective encapsulating material that has a substantially uniform thickness. The edge of the blade 118 that is in contact with the stencil is generally straight such that the resulting epoxy layer can be given a substantially flat surface. To ensure that the surface of the encapsulating material 200 receive a smooth surface, the surface of the blade 118 that sweeps away excess encapsulating material may be ground to have a smooth finish. A smooth encapsulant layer 200 allows for the application of identification marks upon the encapsulant layer 200 that are clearer and therefore more easily identified during manufacturing processes. The smooth surface of the blade 118 also provides an operational benefit of reducing the amount of encapsulating material that may adhere to the blade 118 itself.

Figure 3:
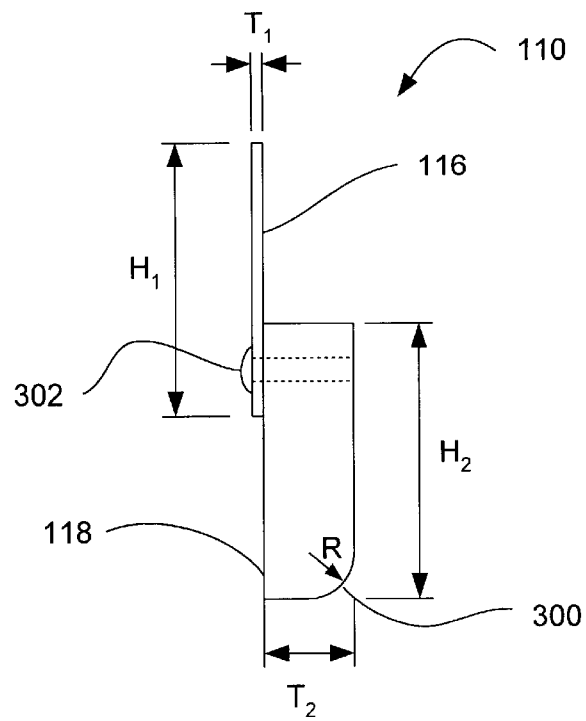
FIG. 3 illustrates a side plan, cross-sectional view of an applicator of the present invention according to one embodiment.
Figure 4:
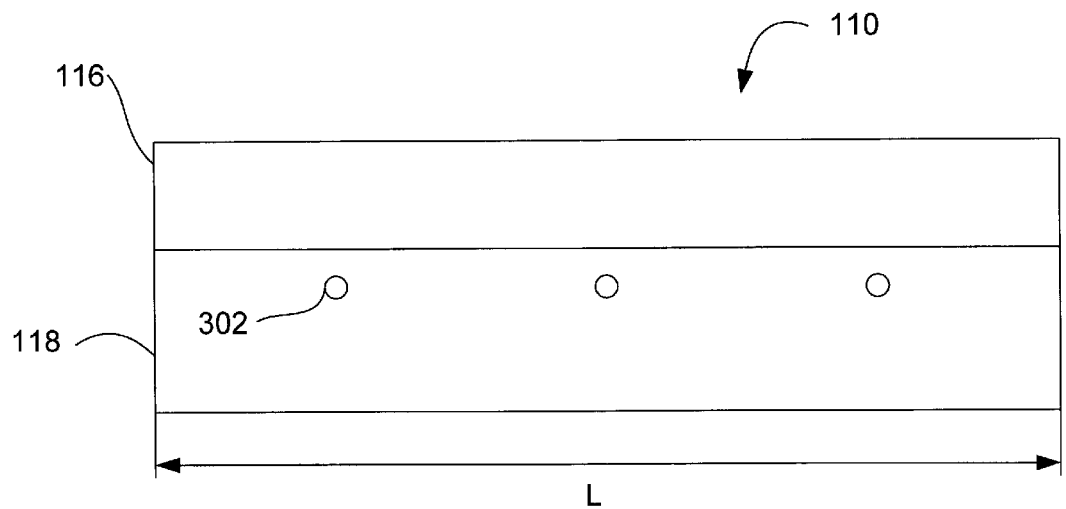
FIG. 4 illustrates a front plan view of the applicator of FIG. 3.

To describe the structure of the applicator 110 in greater detail, the side and front views of one specific embodiment of the applicator 110 is illustrated in FIGS. 3 and 4. In this embodiment, the applicator 110 has a length, L, of approximately 8 inches. This applicator 110 generally is used to smooth a layer of encapsulating material applied to the surface of wafers having 6-inch diameters or less. It is possible to use this applicator with respect to wafers of up to 8-inch diameters. In alternative embodiments, the applicator 110 may have a different length so long as it has a length sufficient to cover the diameter of the opening of a stencil. For example, to apply encapsulating material to an 8-inch wafer, an applicator 110 having a length of at least 10 inches can be used.

In this embodiment of the flexor 116, the flexor 116 has a height, $H_1$, of 1 inch and a thickness, $T_1$, of 8–10 mils. As may be appreciated, the height and thickness of the flexor 116 may vary depending upon specific design requirements. For example, the flexor 116 may be formed to have varying heights, $H_1$, and thickness, $T_1$, such that the flexor 116 exhibits a specific degree of elasticity. The flexor 116 is made of stainless steel however, it may also be made from other flexible materials.

The blade 118, in this embodiment, has a thickness, $T_2$, in the range of approximately 180–250 mils and a height, $H_2$, of approximately 0.6 inches. Also, as may be appreciated, the thickness and the height of the blade 118 may vary depending upon the specific design requirements. For example, the blade 118 may be formed to have varying heights, H2, and thickness, T2, such that the blade 118 exhibits a specific degree of rigidity. The blade 118 is preferably made out of 440C stainless steel due to its resistance to corrosion. In alternative embodiments, the blade 118 may be composed of alternative materials that may also be given a smooth surface and which are also corrosion resistant. For example, the blade 118 could be composed of a composite material of plastic and epoxy.

As illustrated in FIG. 3, some embodiments of the applicator 110 have an edge that is finely ground to have a rounded surface 300. By running the rounded edge 300 of the blade 118, as opposed to a sharp edge, along the surface of the stencil, scraping-type damage that the blade 118 may cause to the stencil 106 is minimized. Preferably, the radius for the rounded edges, R, of the blade 118 is approximately 35–45 mils. However, the radius of the rounded edges may vary outside of this range depending upon the particular type of stencil that is used, the encapsulating material involved, or the pressure applied to the applicator 110.

In this embodiment of the applicator 110, the flexor 116 and the blade 118 are connected via screws 302. Alternatively, it is possible to connect the flexor 116 and the blade 118 using adhesive or any other appropriate attaching mechanisms.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A system for forming a substantially uniform layer of material on a semiconductor wafer comprising:
   the semiconductor wafer having a wafer diameter;
   a stencil that is placed over and in contact with a top surface of the semiconductor wafer, the stencil having an opening that defines and exposes a selected portion of the surface of the semiconductor wafer, wherein the opening has a stencil opening diameter that is approximately the same size as the wafer diameter;
   an applicator, the applicator including,
     a flexor formed of a resilient material having a first end and a second end; and
     a substantially rigid blade having a first edge and a second edge, wherein the first edge is fixedly attached to the first end of the flexor in a way that during a smoothing process, a force applied through the flexor is distributed across the second edge of the blade, and wherein the flexor and the blade are both long enough to span over the diameter of the opening in the stencil; and
   a conveyor device connected to the second end of the flexor, wherein during the smoothing process, the conveyor device is configured to apply the force through the flexor and to move the applicator across the opening of the stencil such that the second edge of the blade is in contact with the stencil and a flowable material applied on the selected portion of the surface of the wafer thereby forming the substantially uniform layer of material on the selected portion of the surface of the semiconductor wafer.

2. A system as recited in claim 1,
   wherein during the smoothing process, the second edge of the blade removes a first portion of the flowable material and leaves a resulting second portion of the flowable material on the selected portion of the surface of the wafer such that the second portion of the material has an upper surface that is coplanar to the surface of the wafer.

3. A system as recited in claim 1, wherein the second edge of the blade has a rounded surface, wherein the rounded surface comes in direct contact with the stencil so as to reduce the amount of damage to the stencil that is caused by the blade.

4. A system as recited in claim 2, wherein the flowable material applied to the surface of the wafer is epoxy.

5. A system as recited in claim 1, wherein the force applied to the flexor is distributed substantially uniformly across the second edge of the blade.

6. An apparatus as recited in claim 1, wherein the blade is sufficiently rigid so as to substantially resist deformation under the force distributed by the flexor.

7. A system as recited in claim 1, wherein the second edge of the blade is straight.

8. A system as recited in claim 2, wherein the flowable material applied to the surface of the wafer is solder paste.

9. A system as recited in claim 1, further comprising:
 a second applicator, the second applicator including,
  a second flexor formed of a resilient material having a first end and a second end; and
  a second substantially rigid blade having a first edge and a second edge, wherein the first edge is fixedly attached to the first end of the second flexor in a way that during a second smoothing process, a second force applied to the second flexor is distributed across the second edge of the second blade;
 the second end of the flexor connected to the conveyor device, wherein during the second smoothing process, the conveyor device is configured to move the second applicator across the opening of the stencil such that the second edge of the second applicator is in contact with the stencil.

10. A system for applying a substantially uniform layer of material on a semiconductor wafer comprising:
 the semiconductor wafer having a wafer diameter;
 a stencil that is placed over and in contact with a surface of the semiconductor wafer, the stencil having a single opening that exposes a portion of the surface of the semiconductor wafer, wherein the opening has a stencil opening diameter that is approximately the same size as the wafer diameter; and
 an applicator, the applicator including,
  a flexor formed of a resilient material having a first end and a second end; and
  a substantially rigid blade having a first edge and a second edge, wherein the first edge is fixedly attached to the first end of the flexor and wherein the second edge is suitable for slidable contact with the stencil, and wherein the flexor and the blade are both long enough to span over the opening in the stencil, wherein a smoothing process proceeds after a flowable material is initially applied on the portion of the surface of the semiconductor wafer and during the smoothing process,
  a force applied through the flexor is distributed evenly across the second edge of the blade thereby applying the substantially uniform layer of material on the portion of the surface of the semiconductor wafer.

11. A system as recited in claim 10 further comprising:
 a conveyor device connected to the second end of the flexor, wherein during the smoothing process, the conveyor device is configured to apply the force through the flexor and to move the applicator across the opening of the stencil.

12. An system as recited in claim 10, wherein the blade is sufficiently rigid such that the blade can resist bending into the opening of the stencil due to the force distributed by the flexor onto the blade.

* * * * *

UNITED STATES PATENT AND TRADEMARK OFFICE
CERTIFICATE OF CORRECTION

PATENT NO. : 6,730,170 B1
DATED : May 4, 2004
INVENTOR(S) : Pham et al.

Page 1 of 1

It is certified that error appears in the above-identified patent and that said Letters Patent is hereby corrected as shown below:

<u>Title page, Item [54] and Column 1, lines 1-3,</u>
Title, change "ENCAPSULANT MATERIAL APPLICATOR FOR SEMICONDUCTOR WAFERS AND METHOD OF USE THEREOF" to
-- ENCAPSULANT MATERIAL APPLICATOR FOR SEMICONDUCTOR WAFERS AND METHODS OF USE THEREOF --.

Signed and Sealed this

Thirteenth Day of July, 2004

JON W. DUDAS
*Acting Director of the United States Patent and Trademark Office*